(12) United States Patent
Oh et al.

(10) Patent No.: US 8,626,996 B2
(45) Date of Patent: Jan. 7, 2014

(54) SOLID STATE MEMORY (SSM), COMPUTER SYSTEM INCLUDING AN SSM, AND METHOD OF OPERATING AN SSM

(71) Applicant: Samsung Electronics Co., Ltd., Suwon-si (KR)

(72) Inventors: Moon-wook Oh, Seoul (KR); Do-geun Kim, Seoul (KR); Chan-ik Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/647,630

(22) Filed: Oct. 9, 2012

(65) Prior Publication Data

US 2013/0042058 A1 Feb. 14, 2013

Related U.S. Application Data

(62) Division of application No. 13/027,299, filed on Feb. 15, 2011, now abandoned, and a division of application No. 12/015,548, filed on Jan. 17, 2008, now abandoned.

(30) Foreign Application Priority Data

Aug. 14, 2007 (KR) .......................... 10-2007-0081832

(51) Int. Cl.
*G06F 12/06* (2006.01)
(52) U.S. Cl.
USPC .................................. 711/103; 711/E12.008

(58) Field of Classification Search
USPC ......................................................... 711/103
See application file for complete search history.

(56) References Cited

U.S. PATENT DOCUMENTS

| | | | |
|---|---|---|---|
| 5,671,388 A | 9/1997 | Hasbun | |
| 5,802,554 A | 9/1998 | Caceres et al. | |
| 5,966,326 A | 10/1999 | Park et al. | |
| 6,330,572 B1 | 12/2001 | Sitka | |
| 6,701,421 B1 | 3/2004 | Elnozahy et al. | |
| 6,785,767 B2 | 8/2004 | Coulson | |
| 7,457,897 B1 * | 11/2008 | Lee et al. ........................ | 710/74 |
| 2002/0051394 A1 | 5/2002 | Tobita et al. | |
| 2005/0081009 A1 | 4/2005 | Williams et al. | |

(Continued)

FOREIGN PATENT DOCUMENTS

| | | |
|---|---|---|
| JP | 06028246 A | 2/1994 |
| JP | 2002140229 A | 5/2002 |

(Continued)

*Primary Examiner* — Kenneth Lo
(74) *Attorney, Agent, or Firm* — Volentine & Whitt, PLLC (57) ABSTRACT

In one aspect, data is stored in a solid state memory which includes first and second memory layers. A first assessment is executed to determine whether received data is hot data or cold data. Received data which is assessed as hot data during the first assessment is stored in the first memory layer, and received data which is first assessed as cold data during the first assessment is stored in the second memory layer. Further, a second assessment is executed to determine whether the data stored in the first memory layer is hot data or cold data. Data which is then assessed as cold data during the second assessment is migrated from the first memory layer to the second memory layer.

8 Claims, 8 Drawing Sheets

(56) References Cited

U.S. PATENT DOCUMENTS

| | | |
|---|---|---|
| 2006/0152981 A1 | 7/2006 | Ryu |
| 2006/0248259 A1 | 11/2006 | Ryu et al. |
| 2007/0011421 A1 | 1/2007 | Keller et al. |
| 2007/0061502 A1 | 3/2007 | Lasser et al. |
| 2008/0215801 A1 | 9/2008 | Tan et al. |
| 2009/0089486 A1 | 4/2009 | Cheung et al. |
| 2009/0144501 A2 * | 6/2009 | Yim et al. .................... 711/120 |

FOREIGN PATENT DOCUMENTS

| | | |
|---|---|---|
| JP | 2003-022687 | 1/2003 |
| JP | 2006302255 A | 11/2006 |
| KR | 100205240 B1 | 4/1999 |
| KR | 1020030011229 A | 2/2003 |
| KR | 20070008403 | 1/2007 |
| KR | 20070008403 A | 1/2007 |
| WO | WO2007084079 A1 | 7/2007 |

* cited by examiner

SOLID STATE MEMORY (SSM), COMPUTER SYSTEM INCLUDING AN SSM, AND METHOD OF OPERATING AN SSM

CROSS-REFERENCE TO RELATED APPLICATIONS

This is a divisional of application Ser. No. 13/027,299, filed Feb. 1, 2011, which is a divisional of application Ser. No. 12/015,548, filed Jan. 17, 2008, which is incorporated herein by reference in its entirety.

BACKGROUND OF THE INVENTION

1. Field of the Invention

The present invention generally relates to memory systems, and more particularly, the present invention relates to a solid state memory (SSM), a computer system which includes an SSM, and a method of operating an SSM. Examples of the SSM include the main memory of a computer system and the solid state drive (SSD) of a computer system.

A claim of priority is made to Korean Patent Application No. 2007-0081832, filed Aug. 8, 2007, the entirety of which is incorporated herein by reference.

2. Description of the Related Art

A solid state drive (SSD) is a data storage device that typically emulates a conventional hard disk drive (HDD), thus easily replacing the HDD in most applications. In contrast to the rotating disk medium of an HDD, an SSD utilizes solid state memory to store data. With no moving parts, an SSD largely eliminates seek time, latency and other electro-mechanical delays and failures associated with a conventional HDD.

An SSD is commonly composed of either NAND flash (non-volatile) or SDRAM (volatile).

SSDs based on volatile memory such as SDRAM are characterized by fast data access and are used primarily to accelerate applications that would otherwise be held back by the latency of disk drives. The volatile memory of the DRAM-based SSDs typically requires the inclusion of an internal battery and a backup disk system to ensure data persistence. If power is lost, the battery maintains power for sufficient duration of copy data from the SDRAM to the backup disk system. Upon restoration of power, data is copied back from the backup disk to SDRAM, at which time the SSD resumes normal operations.

However, most SSD manufacturers use non-volatile flash memory to create more rugged and compact alternatives to DRAM-based SSDs. These flash memory-based SSDs, also known as flash drives, do not require batteries, allowing makers to more easily replicate standard hard disk drives. In addition, non-volatile flash SSDs retain memory during power loss.

As is well know in the art, single-level cell (SLC) flash is capable of storing one bit per memory cell, while multi-level cell (MLC) flash is capable of storing two or more bits per memory cell. As such, in order to increase capacity, flash SSDs may utilize multi-level cell (MLC) memory banks. However, flash SSDs generally suffer from relatively slow random write speeds, and this operational drawback is further exasperated with relatively slow speeds of MLC flash. As such, it has been suggested to equip SSDs with two types of flash storage media—lower capacity SLC memory banks and higher capacity MLC memory banks. With such a configuration, frequently used data (e.g., directory and/or log information) can be stored in the faster SLC banks, while less frequently used data (e.g., music files, images, etc.) can be stored in the slower MLC banks.

SUMMARY OF THE INVENTION

According to an aspect of the present invention, data is stored in a solid state memory which includes first and second memory layers. A first assessment is executed to determine whether received data is hot data or cold data. Received data which is assessed as hot data during the first assessment is stored in the first memory layer, and received data which is assessed as cold data during the first assessment is stored in the second memory layer. Further, a second assessment is executed to determine whether the data stored in the first memory layer is hot data or cold data. Data which is then assessed as cold data during the second assessment is migrated from the first memory layer to the second memory layer.

According to another aspect of the present invention, a method of storing received data in a solid state memory includes initially storing hot data in a high-speed memory layer and, and then migrating a portion of the data stored in the high-speed memory layer to a low-speed memory layer for storing cold data.

According to yet another aspect of the present invention, a solid state memory system includes a first memory layer, a second memory layer, and a memory controller. The memory controller is configured to execute a first assessment of whether received data is hot data or cold data, to store received data which is assessed as hot data during the first assessment in the first memory layer, and to store received data which is assessed as cold data during the first assessment in the second memory layer. The memory controller is further configured to execute a second assessment of whether the data stored in the first memory layer is hot data or cold data, and to migrate data which is assessed as cold data during the second assessment from the first memory layer to the second memory layer.

According to still another aspect of the present invention, a solid state memory system is configured to operatively connect to a computer operating system and comprises first and second memory layers. An operational speed of the first memory layer is greater than an operational speed of the second memory layer, and the first memory area is operationally hidden from the computer operating system when the solid state memory is operatively connected to the computer operating system.

According to another aspect of the present invention, a computer system includes a processor and a memory. The solid state memory includes a high-speed memory layer and a low-speed memory layer, and the high-speed memory area is operationally hidden from the processor.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

The present invention will now be described by way of preferred, but non-limiting, embodiments of the invention. It is emphasized here that the invention is not limited by the exemplary embodiments described below, and that instead the scope of the invention is delimited by the appended claims.

Figure 1:
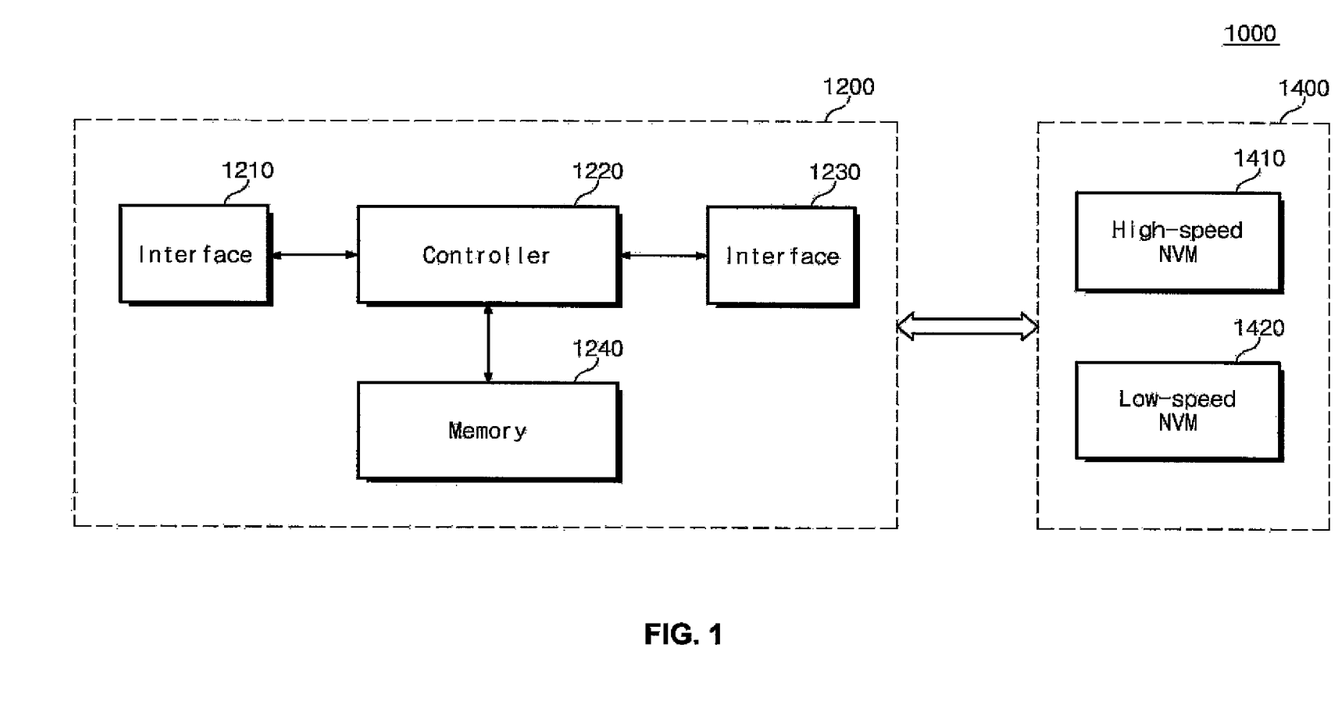
FIG. 1 is a block diagram of a solid state drive (SSD) according to an embodiment of the present invention.

FIG. 1 illustrates a block diagram of a solid state drive (SSD) 1000 according to an embodiment of the present invention. As shown, the SSD 1000 of this example includes an SSD controller 1200 and non-volatile storage media 1400.

The SSD controller 1200 includes first and second interfaces 1210 and 1230, a controller 1220, and a memory 1240.

The first interface 1210 functions as a data I/O interface with a host device, such as a host central processing unit (CPU) (not shown). Non-limiting examples of the first interface 1210 include Universal Serial Bus (USB) interfaces, Advanced Technology Attachment (ATA) interfaces, Serial ATA (SATA) interfaces, Small Computer System Interface (SCSI) interfaces.

The second interface 1230 functions as a data I/O interface with the non-volatile storage media 1400. In particular, the second interface 1230 is utilized to transmit/receive various commands, addresses and data to/from the non-volatile storage media 1400. As will be apparent to those skilled in the art, a variety of different structures and configurations of the second interface 1230 are possible, and thus a detailed description thereof is omitted here for brevity.

The controller 1220 and memory 1240 are operatively connected between the first and second interfaces 1210 and 1230, and together function to control/manage the flow of data between the host device (not shown) and the non-volatile storage media 1400. The memory 1240 may, for example, be an DRAM type of memory device, and the controller 1220 may, for example, include a central processing unit (CPU), a direct memory access (DMA) controller, and an error correction control (ECC) engine. Examples of controller functionality may be found in commonly assigned U.S. Patent Publication 2006-0152981, which is incorporated herein by reference. The operations generally executed by controller 1220 (and memory 1240) to transfer data between the host device (not shown) and SSD memory banks are understood by those skilled in the art, and thus a detailed description thereof is omitted here for brevity. Rather, the operational description presented later herein is primarily focused on inventive aspects relating to various embodiments of the invention.

Still referring to FIG. 1, the non-volatile storage media 1400 of this example includes a high-speed non-volatile memory (NVM) 1410 and a low-speed non-volatile memory (NVM) 1420. As the names suggest, the high-speed NVM 1410 is capable of operating at a relatively higher speed (e.g., random write speed) when compared to the low-speed NVM 1420.

In an exemplary embodiment, the high-speed NVM 1410 is single-level cell (SLC) flash memory, and the low-speed NVM 1420 is multi-level cell (MLC) flash memory. However, the invention is not limited in this respect. For example, the high-speed NVM 1410 may instead be comprised of phase-change random access memory (PRAM), or MLC flash memory in which one bit per cell is utilized. Also, the high-speed NVM 1410 and the low-speed NVM 1420 may be comprised of the same type of memory (e.g., SLC or MLC or PRAM), where the operational speed is differentiated by fine-grain mapping in the high-speed NVM 1410 and coarse-grain mapping in the low-speed NVM 1420.

Generally, the high-speed NVM 1410 is utilized to store frequently accessed (written) data such as meta data, and the low-speed NVM 1420 is utilized to store less frequently accessed (written) data such as media data. In other words, as will discussed later herein, a write frequency of data in the high-speed NVM 1410 is statistically higher than a write frequency of data in the low-speed NVM 1420. Also, due to the nature of the respective data being stored, the storage capacity of the low-speed NVM 1420 will typically be much higher than that of the high-speed NVM 1410.

In an exemplary embodiment, the high-speed NVM 1410 is hidden from an external operating system connected to the SSD. This aspect of the embodiment is illustrated in FIGS. 2 and 3.

Figure 2:
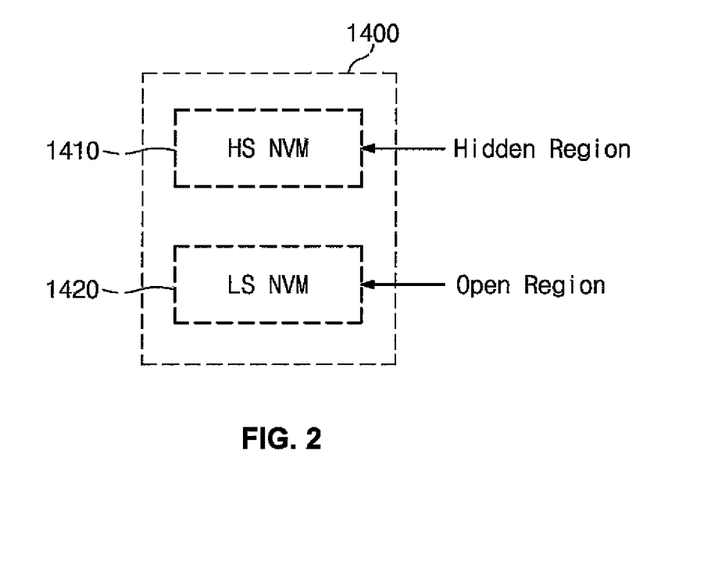
FIGS. 2 and 3 are block diagrams for describing a non-volatile storage media in the SSD of FIG. 1 according to an embodiment of the present invention.
Figure 3:
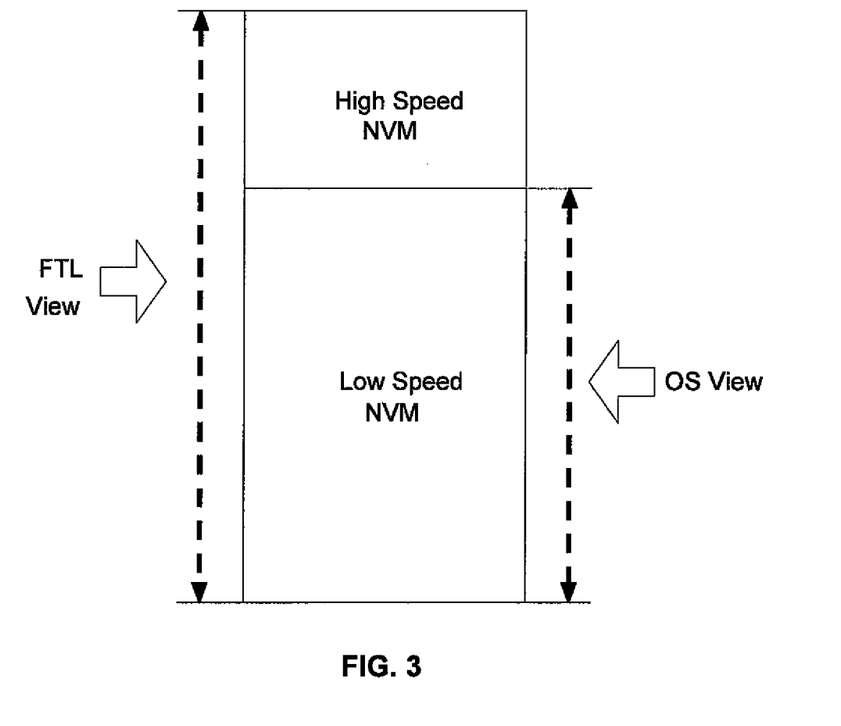

Referring collectively to FIGS. 2 and 3, the high-speed NVM 1410 of the example of this embodiment is a hidden region—that is, the high-speed NVM 1410 is cannot be seen (directly addressed) by the external operating system (OS). Rather, the address space shown relative to the OS view is only the low-speed NVM 1420. On the other hand, the address space shown relative to the Flash Translation Layer (FTL) is both the high-speed NVM 1410 and the low-speed NVM 1420. The FTL translates an address provided by the OS into a physical address of the non-volatile storage media 1400 (i.e., a physical address within the high-speed NVM 1410 or the low-speed NVM 1420).

Figure 4:
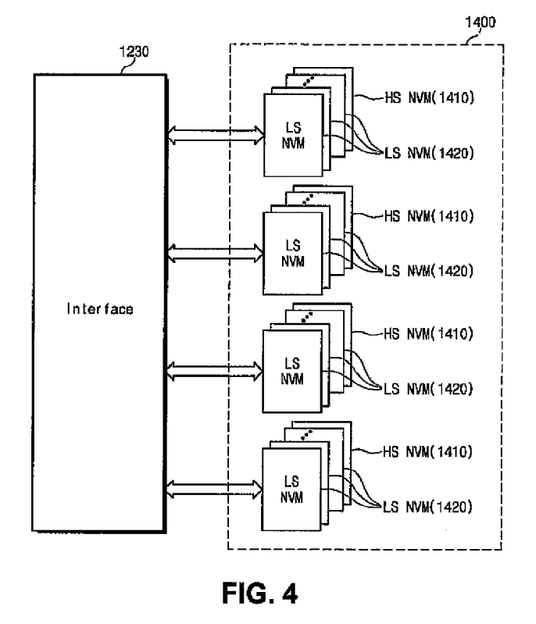
FIGS. 4 and 5 are block diagrams for describing alternative ways of coupling a non-volatile storage media to an interface in the SSD of FIG. 1 according to embodiments of the present invention.
Figure 5:
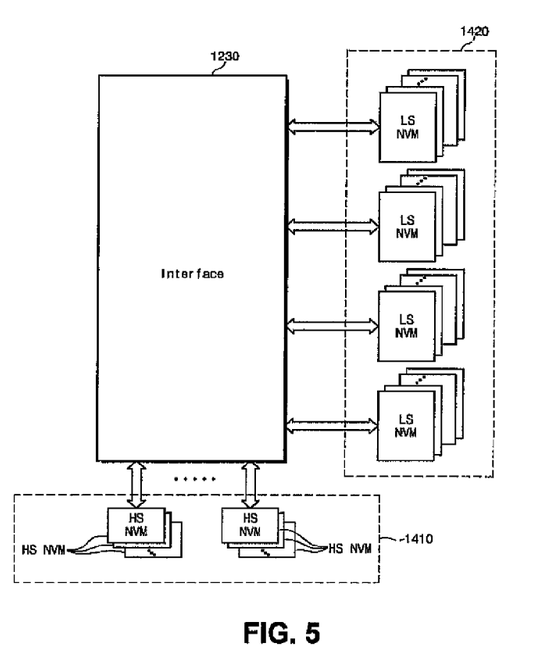

Turning to the block diagrams of FIGS. 4 and 5, there are a number of different ways in which the high-speed NVM 1410 and the low-speed NVM 1420 can be operative connected to the controller 1220 (FIG. 1) via the interface 1230. In the example of FIG. 4, the high-speed NVM 1410 and the low-speed NVM 1420 communicate via the interface 1230 using common interface channels. In the example of FIG. 5, the high-speed NVM 1410 and the low-speed NVM 1420 communicate via the interface 1230 using separate interface channels.

It is again noted, however, that the high-speed NVM 1410 and the low-speed NVM 1420 need not be composed of different types of memory. That is, a single type of memory may be operationally segregated into a high-speed layer and a low-speed layer. For example, the grain mapping in the two layers may differ, or the number of bits utilized per cell in the two layers may differ. Further, the high-speed memory layer and the low-speed memory layer may be segregated at the chip level (e.g., contained in different memory chips), or within the same memory chip (e.g., contained in different memory blocks or groups of memory cells of the same memory chip).

An operational description of the SSD according to embodiments of the present invention is presented next.

According to an embodiment of the present invention in which data is stored in the SSD, a first assessment is executed to determine whether received data is hot data or cold data. As will be understood by those skilled in the art, "hot" data is a term of art that refers to data which is frequently written or updated (requiring write access), such as a directory information and/or logging information. "Cold" data is all other data, i.e., data which is not frequently written or updated, such as image files, sound files, program code and so on. Cold data may be written once or infrequently, but read frequently. Thus, it is the frequency of write access that separates hot data from cold.

Received data which is assessed as hot data during the first assessment is stored in the high-speed NVM 1410, and received data which is first assessed as cold data during the first assessment is stored in the low-speed NVM 1420.

Then, a second assessment is executed to determine whether the data stored in the high-speed NVM 1410 is hot data or cold data. In other words, the data stored in the high-speed NVM 1410 reassessed to determine with the data should be reclassified as cold data. Data which is then assessed as cold data during the second assessment is migrated from the high-speed NVM 1410 to the low-speed NVM 1420.

By periodically migrating data which initially determined to be hot data from the high-speed NVM 1410 to the low-speed NVM 1420, the size of the high-speed NVM 1410 can be reduced. This can potentially result in cost savings, and increase the overall storage capacity of the SSD (e.g., by allowing for more space for the high-capacity MLC layer).

The second assessment and migration of data to the low-speed NVM 1420 can be programmed to occur, for example, when the unused capacity of the high-speed NVM 1410 is less than a preset value. Alternately, for example, the second assessment and migration of data to the low-speed NVM 1420 can be programmed to occur at given periodic intervals, or when the SSD is idle. Examples of an idle state may include periods in which no read/write request is received from the host, or when the activation ratio or intensity of read/write requests is less than a threshold.

Figure 6:
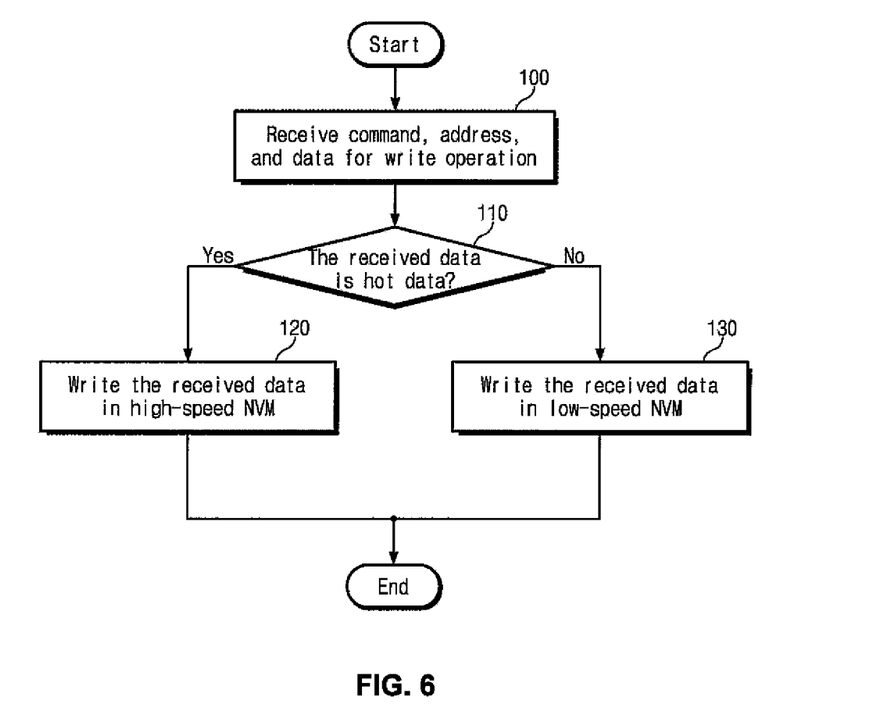
FIGS. 6 through 8 are flow charts for use in describing methods of allocating data to regions of a non-volatile storage media in the SSD of FIG. 1 according to embodiments of the present invention.

FIG. 6 is a flow chart for use in describing the first assessment and storage (write) of data in the SSD according to an embodiment of the present invention.

Initially, at step 100, a write command, an address and data are received. Then, at step 110, a determination is made as to whether the received data is classified as hot data. If the received data is classified as hot data, the received data is stored in the high-speed NVM 1410 at step 120. On the other hand, if the received data is not classified as hot data, the received data is stored in the low-speed NVM 1420 at step 130.

It should be noted that data stored in the low-speed NVM 1420 at step 130 may first be "passed through" the high-speed NVM 1410. In other words, the data may first be briefly (temporarily) stored in the high-speed NVM 1410, and then stored in the low-speed NVM. In this case, the high-speed NVM 1410 essentially acts as a memory buffer for the low-speed NVM 1420.

Figure 7:
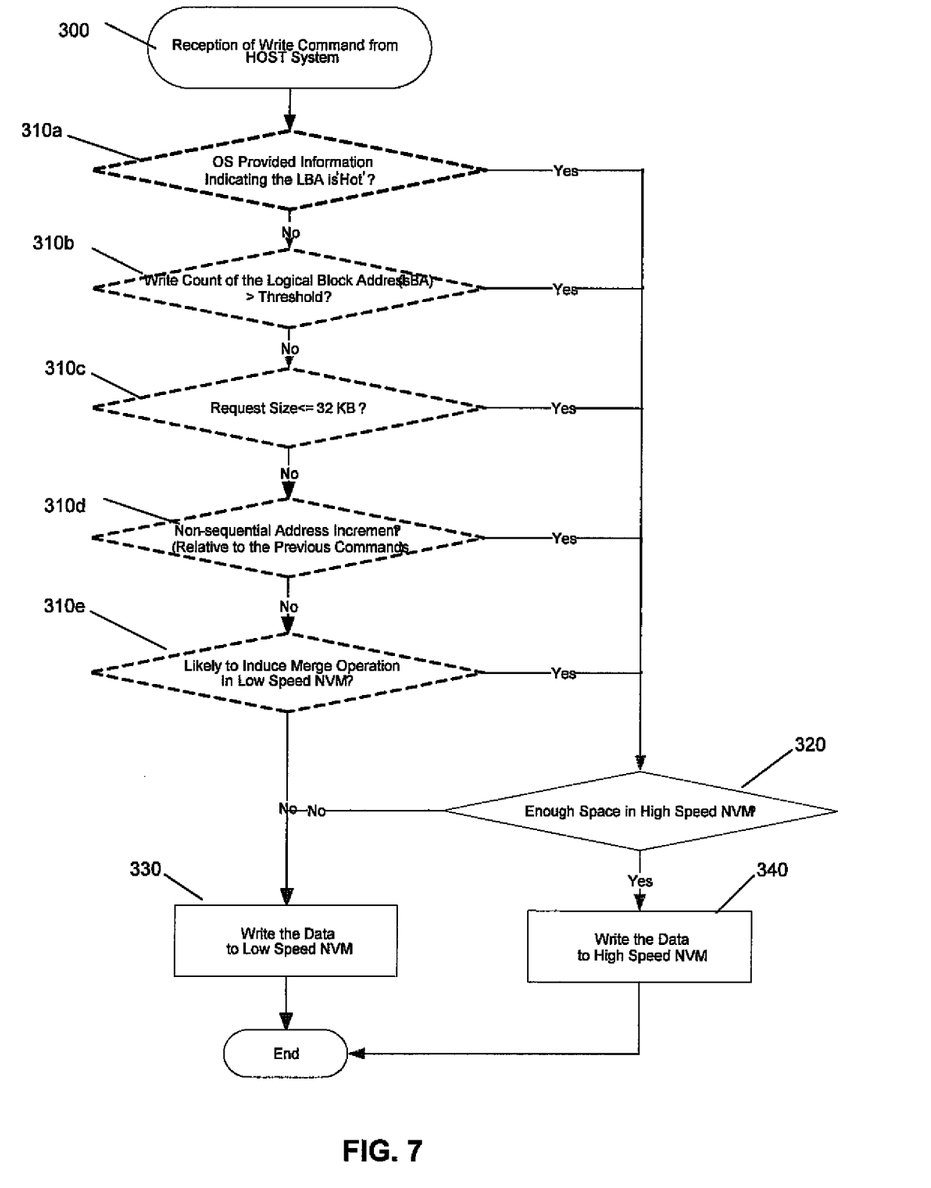

FIG. 7 is a flow chart for use in describing the first assessment and storage (write) of data in the SSD according to another embodiment of the present invention.

Initially, at step 300, a write command, an address and data are received. Then, at steps 310*a* through 310*e*, a determination is made as to whether the received data is to be classified as hot data. If the received data is classified as hot data, and if there is sufficient available space in the high-speed NVM 1410 (step 320), the received data is stored in the high-speed NVM 1410 at step 340. On the other hand, if the received data is not to be classified as hot data, or if there is insufficient available space in the high-speed NVM 1410, the received data is stored in the low-speed NVM 1420 at step 330.

There are a number of different ways in which the received data might be classified as hot data, and steps 310*a* through 310*e* of FIG. 7 represent a non-exhaustive list of decision processes which can be used in the classification. These steps can be used in combinations of two or more, or individually, depending on the desired level of accuracy in the first assessment of the received data.

At step 310*a*, a determination is made as to whether the operating system (OS) has provided information that the data is hot data. If so, the data is classified as hot data, and the process proceeds to step 320.

At step 310*b*, a determination is made as to whether the write count of the logical block address has exceeded a predetermined threshold. If so, the data is classified as hot data, and the process proceeds to step 320.

At step 310*c*, a determination is made as to whether the request size of the data is less then predetermined threshold (e.g., less than 32 KB). If so, the data is classified as hot data, and the process proceeds to step 320.

At step 310*d*, a determination is made as to whether there is a non-sequential address increment relative to the previously received command. If so, the data is classified as hot data, and the process proceeds to step 320.

At step 310*e*, a determination is made as to whether a merge operation is likely to be induced in the low-speed NVM. If so, the data is classified as hot data, and the process proceeds to step 320.

Although not shown in FIG. 7, in the case where insufficient space exists in the high-speed NVM (step 320), and alternative would be to create available space by migrating already stored cold data of the high-speed NVM to the low-speed NVM, and then storing the new hot data in the high-speed NVM.

Also, with reference to above-described processes of FIGS. 6 and 7, it is noted that the embodiments thereof are not limited to storing all of the hot and cold data in the high-speed and low-speed NVMs, respectively. For example, some of the data initially assessed as cold data may be stored in the high-speed NVM. Also, though less preferable, some of the data initially assessed as hot data may be stored in the low-speed NVM.

Figure 8:
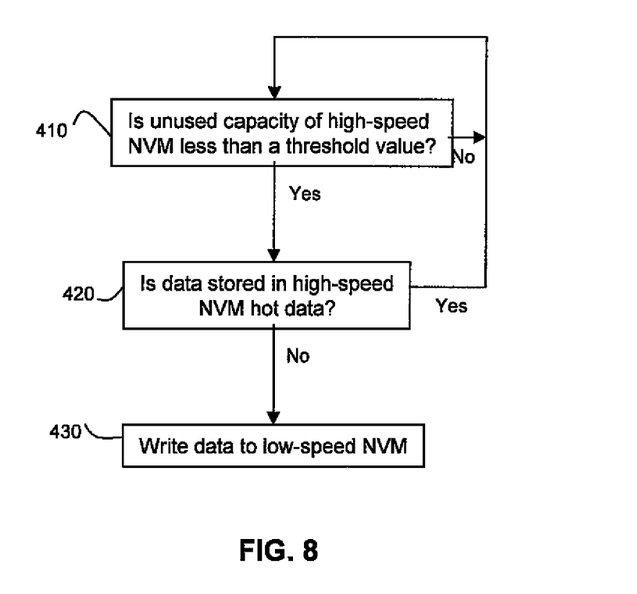

FIG. 8 is a flow chart for use in describing an example of the second assessment and migration of data to the low-speed NVM in the SSD according to an embodiment of the present invention.

Initially, at step 410, a determination is made as to whether an unused memory capacity of the high-speed NVM is less than a predetermined threshold value. As suggested previously, this step can be supplemented with (or replaced with) a periodic execution step in which step 410 (or step 420 below) is executed at periodic intervals, and/or with a SSD idle determination step in which step 410 (or step 420) is executed at periodic intervals.

Next, at step 420, a determination is made as to whether data stored in the high-speed NVM is hot data, i.e., whether the data may be reclassified as cold data.

Then, at step 430, reclassified cold data which stored in the high-speed NVM is migrated to the low-speed NVM.

There are a number of different ways in which the determination of step 420 may be executed. For example, it is possible to examine the write count value of each valid data in the high-speed NVM, and to then reclassify data having low write counts as cold data. Alternately, it is possible to carry out a FIFO-type assessment in which old (first come) valid data is reclassified as cold data.

With reference to above-described process of FIG. 8, it is noted that the embodiment thereof is not limited to migrating all of the cold data to the low-speed NVM. For example, some of the data assessed as cold data may be retained in the high-speed NVM.

Figure 9:
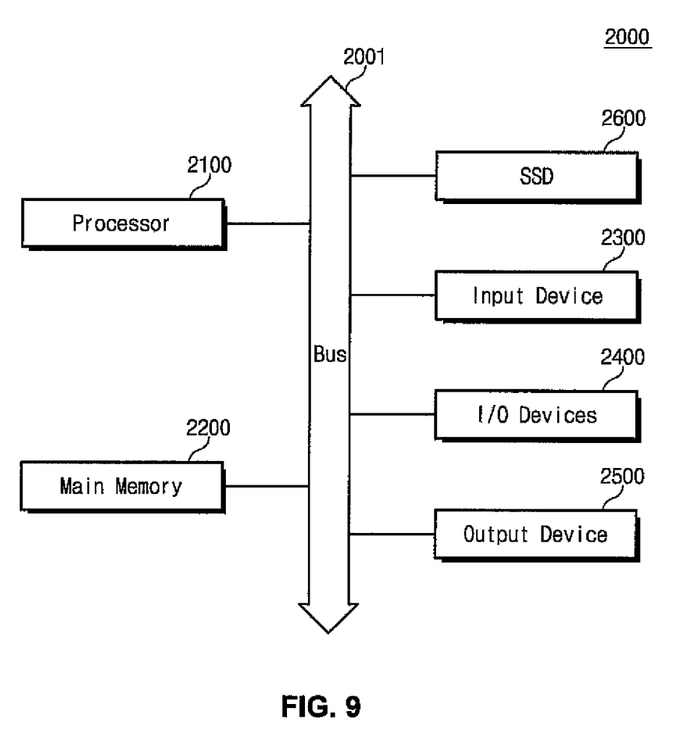
FIG. 9 is a block diagram of the computer system including an SSD according to an embodiment of the present invention.

FIG. 9 is a block diagram of a computer system according to an embodiment of the present invention. As shown in the figure, a processor (host) 2100 and main memory 2200 communicate over a data bus 2001. Also connected to the bus 2001 are an output device 2500 (e.g., display), an input device 2300 (e.g., keyboard), other I/O devices 2400, and a solid state drive SSD. The solid state drive is configured according to one or more of the previously described embodiments of the invention.

Figure 10:
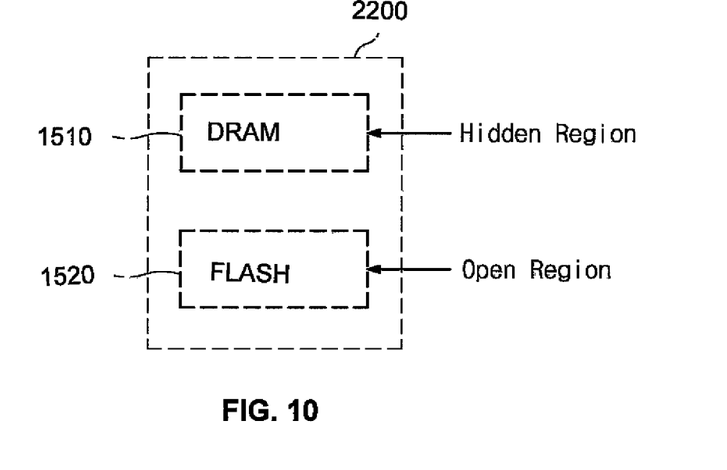
FIGS. 10 and 11 are block diagrams of a main memory according to embodiments of the present invention.
Figure 11:
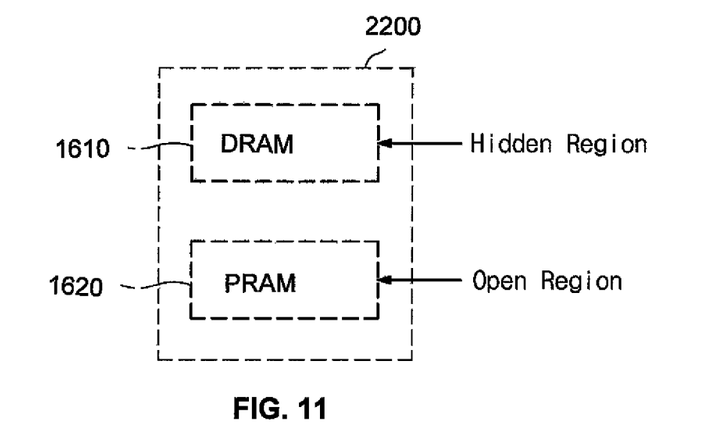

Embodiments of the present invention have been described primarily in the context of solid state drives (SSDs). However, the invention is not limited to SSD applications. For example, FIG. 10 illustrates an embodiment where the high-speed memory layer and the low speed memory layer constitute the main memory 2200 of the computer system shown in FIG. 9. In FIG. 10, the high-speed memory layer 1510 includes DRAM cells and may be a hidden region relative to the processor 2100 of FIG. 9. The low-speed memory layer 1520 of FIG. 10 includes flash cells (either SLC or MLC) and may be open relative to the processor 2100 of FIG. 9. FIG. 11 illustrates another example of a main memory 2200. As shown, the high-speed memory layer 1610 includes DRAM cells and may be a hidden region relative to the processor 2100 of FIG. 9, and the low-speed memory layer 1620 includes phase-change random access memory (PRAM) cells and may be open relative to the processor 2100 of FIG. 9.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A solid state memory comprising:
a nonvolatile storage medium comprising a first a nonvolatile memory (NVM) comprising single level cells and a second NVM comprising multi-level cells;
a controller comprising a CPU, a memory, a host interface, and NVM interface,
wherein the host interface is configured to receive a write command, an address, and data from a host system, the CPU is configured to perform a first assessment before the data is stored in the nonvolatile storage medium to determine whether the data is hot or, the first NVM is configured to store the data if the data is determined to be hot in the first assessment, and the second NVM configured to store the data if the data is determined to be cold in the first assessment, and the CPU is further configured to perform a second assessment, if the data is stored in the first NVM, to determine whether the stored data is hot or cold, and to migrate the data from the first NVM to the second NVM upon determining that the data is cold in the second assessment,
wherein the NVM interface is operatively connected to the first NVM and the second NVM, the NVM interface and the first NVM connected through a first channel and the NVM interface and the second NVM connected through a second channel, the first channel and the second channel being separated from each other, and
wherein the second assessment is performed according to a periodic interval or an idle state of the solid state memory.

2. The solid state memory of claim 1, wherein an operation speed of the first NVM is higher than an operation speed of the second NVM.

3. The solid state memory of claim 1, wherein the first NVM comprises a single level cell (SLC) flash memory and the second NVM comprises a multilevel cell (MLC) flash memory.

4. A method of storing data in a nonvolatile storage media comprising a first nonvolatile memory (NVM) and a second NVM, the method comprising:
receiving a write command, an address and data from a host system;
performing a first assessment to determine whether an operating system of the host system has provided information that the data is hot data;
storing the data in the first NVM if the first assessment determines that the data is hot;
storing the data in the second NVM if the first assessment determines that the data is not hot; and
if the data is stored in the first NVM, performing a second assessment subsequent to the first assessment to determine whether the data is hot, and upon determining that the data is not hot, migrating the data to the second NVM,
wherein the second assessment is performed according to a periodic interval or an idle state of an apparatus incorporating the nonvolatile storage media.

5. The method of claim 4, further comprising, if the data is hot and after the data is stored in the first NVM:
determining if unused capacity of the first NVM is less than a threshold capacity value;
when the unused capacity is less than the threshold capacity value, determining if a write count value of the data stored in the first NVM is less than a threshold write count value; and
migrating the data stored in the first NVM into the second NVM if a write count value is less than the threshold write count value.

6. The method of claim 5, wherein migrating the data stored in the first NVM into the second NVM is executed at periodic intervals or when the solid state memory enters an idle state.

7. The method of claim 4, wherein an operation speed of the first NVM is higher than an operation speed of the second NVM.

8. The method of claim 4, wherein the first NVM comprises a single level cell (SLC) flash memory and the second NVM comprises a multilevel cell (MLC) flash memory.

* * * * *